United States Patent
Bennett et al.

(10) Patent No.: US 12,218,264 B2
(45) Date of Patent: Feb. 4, 2025

(54) HALF-CELL PHOTOVOLTAIC MODULES

(71) Applicant: PHAROS SOLAR LLC, Bellingham, WA (US)

(72) Inventors: Ian Bennett, Echt (NL); Paolo Di Lorenzo, Echt (NL); Mark Rossetto, Echt (NL)

(73) Assignee: SILFAB INC., Mississauga (CA)

(*) Notice: Subject to any disclaimer, the term of this patent is extended or adjusted under 35 U.S.C. 154(b) by 178 days.

(21) Appl. No.: 17/605,922

(22) PCT Filed: Apr. 24, 2020

(86) PCT No.: PCT/EP2020/061478
§ 371 (c)(1),
(2) Date: Oct. 22, 2021

(87) PCT Pub. No.: WO2020/216912
PCT Pub. Date: Oct. 29, 2020

(65) Prior Publication Data
US 2022/0254943 A1  Aug. 11, 2022

Related U.S. Application Data

(60) Provisional application No. 62/839,184, filed on Apr. 26, 2019.

(30) Foreign Application Priority Data

May 7, 2019 (EP) .................................. 19173056

(51) Int. Cl.
*H01L 31/05* (2014.01)
*H01L 31/048* (2014.01)
(Continued)

(52) U.S. Cl.
CPC ........ *H01L 31/0516* (2013.01); *H01L 31/048* (2013.01); *H01L 31/049* (2014.12); *H01L 31/0512* (2013.01); *H01L 31/1876* (2013.01)

(58) Field of Classification Search
CPC ............. H01L 31/0512; H01L 31/0516; H01L 31/048; H01L 31/049; H01L 31/1876
See application file for complete search history.

(56) References Cited

U.S. PATENT DOCUMENTS

2015/0349703 A1* 12/2015 Morad ................. H01L 31/049
                                                              136/251
2017/0186900 A1   6/2017 Van Aken
2018/0108796 A1*  4/2018 Heng .................... H01L 31/074

FOREIGN PATENT DOCUMENTS

AU  2019204320 A1 * 2/2020  ....... H01L 31/02013
CN  109244147 A   * 1/2019  ....... H01L 31/02013
(Continued)

OTHER PUBLICATIONS

Halm, Andreas et.al. 2016, Module integration for back contact back junction solar cells, Module integration for back contact back junction solar cells, Jan. 10, 2016, 1-27, n.a.
(Continued)

*Primary Examiner* — Lindsey A Buck
(74) *Attorney, Agent, or Firm* — DLA PIPER LLP (US)

(57) ABSTRACT

The present invention relates a photovoltaic module comprising 126, 138 or 150 back-contact half-cells. In an embodiment, the half-cells are divided into 3 groups of each 2 parallel strings with each string containing ⅙ of the total number of half-cells. The module comprises an additional row of 6 back-contact half-cells, relative to known half-cell modules.

21 Claims, 3 Drawing Sheets

(51) Int. Cl.
*H01L 31/049* (2014.01)
*H01L 31/18* (2006.01)

(56) References Cited

FOREIGN PATENT DOCUMENTS

| | | |
|---|---|---|
| CN | 107275420 B | 4/2019 |
| GB | 2564123 A | 1/2019 |
| WO | 2017019308 A1 | 2/2017 |
| WO | 2017021289 A1 | 2/2017 |

OTHER PUBLICATIONS

Shingled et.al., As Half-Cut Technology Becomes Commonplace, As Half-Cut Technology Becomes Commonplace, 2019 Expo Tokyo, 1-41, n.a.

* cited by examiner

HALF-CELL PHOTOVOLTAIC MODULES

CROSS-REFERENCE TO RELATED APPLICATIONS

This application is a US National Phase Entry under 35 USC 371 of international application PCT/EP2020/061478, which claims priority to U.S. Provisional Patent Appl. No. 62/839,184, filed 26 Apr. 2019, and European Application No. EP19173056.3, filed 7 May 2019, the entire contents of each of which is hereby incorporated by reference in its entirety.

FIELD

The present invention relates to a photovoltaic module comprising back-contact half-cells. The invention also relates to a process for the manufacturing of a photovoltaic module comprising the back-contact half-cells.

BACKGROUND

Photovoltaic modules comprising conventional half-cells are known in the art. Modules comprising conventional half-cells with interconnection by tabbing and bussing are used to improve module performance by reducing the current produced by the cells and so reducing resistances losses in the module. Tabbing and bussing are two applications that link individual solar cells or half-cells together to form a solar module (or solar panel). These applications also provide a method to transfer power from the solar cells to a power output, called the junction box. Solar cell interconnect occurs when individual solar cells are joined together with tabbing ribbon (also called stringing ribbon), forming a cluster of solar cells. This is frequently referred to as cell tabbing (or stringing). The tabbing ribbon carries the solar cell's current to a larger ribbon, the bus ribbon, which then carries power from the cell clusters to the module's junction box for final output. Tabbing ribbons are commonly applied as parallel strips that weave from the top of one cell to the bottom of the next to connect the positive and negative sides of the cells in series.

As known, halving cells results in half the current which reduces resistance losses by up to one quarter, although in practice the additional connections make this closer to one half. Power output gain for a 120 half-cell module relative to a conventional 60 cell module is typically in the order of 6 to 8 Wp, depending on cell efficiency. However, the disadvantage of these half-cells with tabbing is that twice as many components (half-cells and tabs) are needed to construct the module which significantly increases the required manufacturing time. Another disadvantage is that the module comprising the half-cells is larger in size compared to a module comprising full cells as there is more space between the cells due to the increased number of cells. The distance between cells is typically 3 mm, so for a 10×6 full-cell module, the total distance between the cells in the length of the module is 27 mm, whereas for the half-cell module the total distance is up to 57 mm. Even if the distance between the cells could be reduced to 2.5 or 2 mm by using thinner tabbing to accommodate the lower current, the total distance between the cells will be 38 mm for the half-cell module. A larger module size requires more glass and a longer frame so increasing the cost of the module.

Photovoltaic modules comprising conventional half-cells are disclosed in for example WO2017021289.

SUMMARY

In a back-contact module comprising a conductive backsheet, the distance between the cells is not determined by tabbing passing between the cells. The cells are placed closer together so that the overall dimensions of a module with a conductive backsheet is smaller than with an equivalent tabbed module comprising conventional half-cells. The bussing, typically present at the top and bottom and for certain configurations also in the middle of the module, connecting the strings is also integrated in the conductive backsheet, further reducing the overall dimensions. For full-size modules with 60 cells of length 156.75 mm, the overall dimensions of a back-contact module with a conductive backsheet are typically 1622×980 mm or 1602.5×971.5 mm, whereas for a conventional tabbed module with the same cell dimensions typical dimensions are 1650×992 mm or 1651×979 mm. For half-cell modules with 120 back-contact half-cells interconnected with a conductive backsheet, typical dimensions are 1634×980 mm or 1612.5×971.5 mm, whereas for tabbed half-cell modules typical dimensions are 1675×992 mm or 1676×979 mm.

Photovoltaic modules comprising back-contact half-cells are known in the art. In Andreas Halm et al., $2^{nd}$ HERCULES workshop, Berlin, October 2016, "Module integration for back-contact back junction solar cells", a module is disclosed comprising a back-contact backsheet and 120 back-contact half-cells. The module configuration is very similar to how a conventional tabbed module with half-cells would be constructed with the module divided in two halves and the junction boxes positioned in the middle of the module. The top and bottom halves of the module are configured in 3 strings of 20 half-cells per string. Each string is connected to a junction box and each junction box contains a bypass diode. The gain in power is limited due to the high conductivity of the conductive backsheet. Conductivity is not technically limited in back-contact modules as it is in conventionally tabbed modules, so gains in module performance by halving the size of the cell and so halving the current are not as significant for a module made with a conductive backsheet when compared to a conventionally tabbed module. In an embodiment, a photovoltaic module comprises 126, 138 or 150 back-contact half-cells whilst the area of the module is equivalent to a tabbed module containing 120, 132 or 144 half-cells, respectively.

The invention may show an improved power output while retaining the same or similar overall dimensions when compared to a module comprising conventionally tabbed half-cells and/or reduce the manufacturing complexity and fabrication time of the photovoltaic module. Other advantages may include improved efficiency, improved temperature behavior, improved shading behavior, improved power to weight ratio, or other improvements in module performance.

DETAILED DESCRIPTION

It has been found that an extra row of back-contact half-cells can be applied in the module without affecting the regular size of a module to provide a boost in power output over the 120 half-cell modules known in the art. The power output of a solar module is rated in Watt-peak (Wp). This value specifies the output power achieved by a module under full solar radiation under set Standard Test Conditions (STC). STC means: a light intensity of 1.000 W/m², sunlight hitting the positioned solar cells perpendicularly, a temperature of 25° C. at the solar cells and a standard airmass (AM) of 1.5. AM is a measure for the relative length of the optical path through the atmosphere. The Watt-peak is a specific feature of a module, regardless of the location where it is tested. Under these standard conditions, the nominal power of solar modules can be compared with each other.

The width or length of the module according to the present invention means a width able to accommodate 6 columns of cells and a length corresponding to 21, 23 or 25 rows of half-cells, depending on whether the module comprises 126, 138, or 150 half-cells, respectively. In an embodiment, the module comprises six columns of half-cells and each column of half-cells comprises an odd number of cells. In an embodiment, a line of symmetry of the module cell layout bisects each half-cell in a row of half-cells.

The use of 120 back-contact half-cells in a module with a conductive backsheet will however not give the same improvement in performance as seen for conventional tabbed modules as the conductivity in the back-contact module with a conductive backsheet is not limiting. The loss in fill-factor between cells and modules, an indication of the resistive losses in the module, for full-size back-contact cells with a conductive backsheet is typically less than 1%, depending on the thickness of the conductive layer used. Using half-cells will reduce these losses by the same percentage as for conventional cells, but as the losses are already low, the effect on power output will be limited to less than 1.5 W.

An additional advantage of using a conductive backsheet in the present invention is the ease of integrating parallel and series interconnections in the module. Using a conductive backsheet allows more flexibility in parallel and series circuits.

Figure 1:
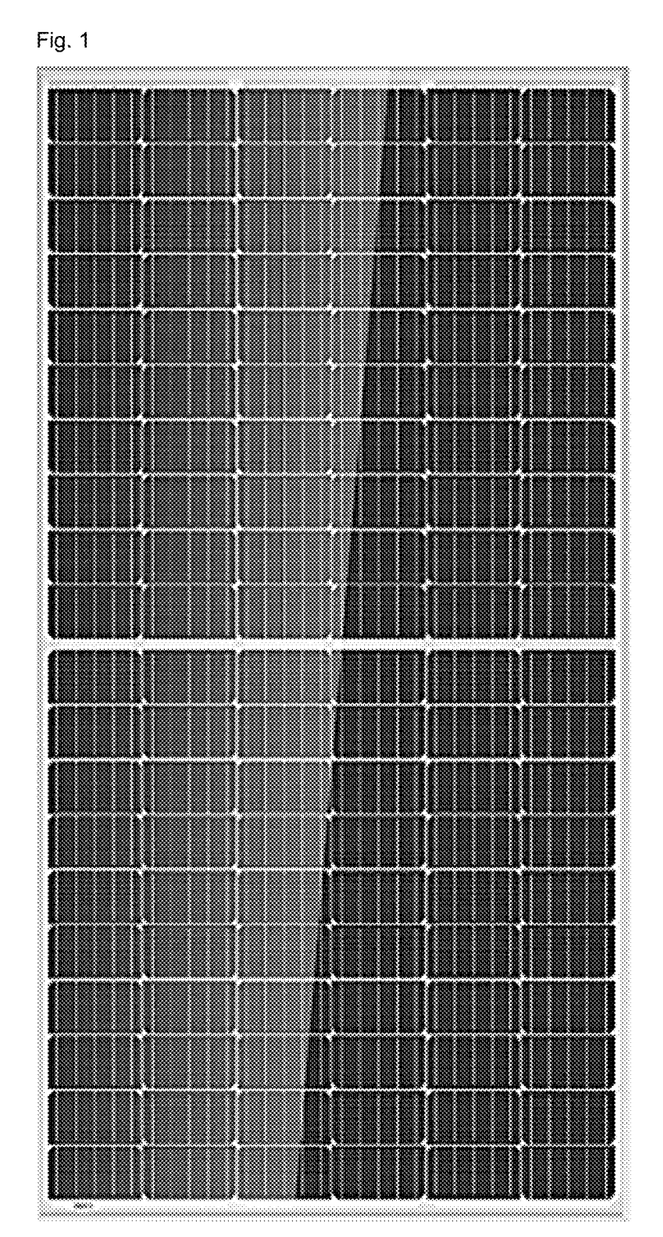
FIG. 1 depicts a conventional 120 half-cells module of the prior art.

FIG. 1 depicts a typical conventional 120 half-cells module with parallel connection between two series circuits of 60 half-cells in the middle of the module. The two halves of the module above and below the parallel connection must be balanced in the number of half-cells. For conventional tabbed half-cell modules, the number of configurations is limited by the requirement for the bussing to be straight. The current direction is only changed at the top and bottom of the string through bussing between two strings. In addition, there is no easy way to implement an additional conductor track in a conventional module, implying that the junction box needs to be at the junction of a string. The limitations imposed by conventional tabbing results in a balanced module only being achieved with 6 half strings of half-cells centrally connected to three junction boxes.

For the photovoltaic module comprising 126 back-contact half-cells, several configurations are possible. In an embodiment, a module comprises three groups of half-cells, each group comprising two parallel strings, and each string containing ⅙ of the total number of half-cells in the module. The strings are combined in parallel so that the current and voltage output of the modules is similar to that of a conventional module, so making the half-cell module suitable for use with standard inverters and other system components. In an embodiment, a conductor track for the junction box is included in the pattern of a conductive backsheet giving freedom for placement of the junction box. In a half-cell module made with a conductive backsheet the lack of limitations in string length and junction box position mean that an additional row of cells can be included in the cell matrix. In an embodiment, there is no need to use half strings as tracks to the junction box and so the tracks can be included between two strings of half-cells. The junction box can then be placed at any position along this track. Such a feature allows for the construction of a PV module comprising 126, 138 or 150 half-cells.

Figure 2:
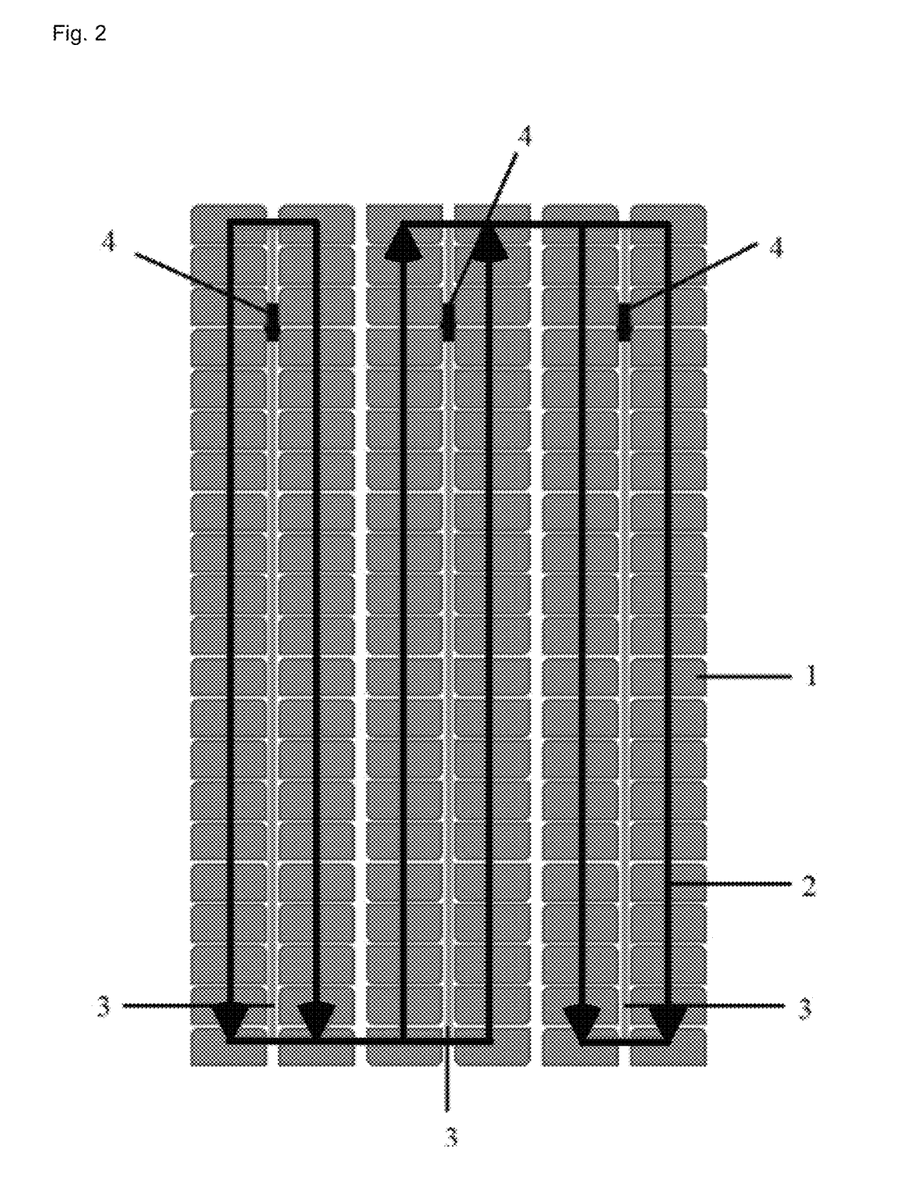
FIG. 2 depicts a schematic of an embodiment of a 126 half-cell module.

FIG. 2 depicts an embodiment of a half-cell module. The module comprises 126 half-cells 1. The direction of current flow 2 is depicted by the arrows. The tracks 3 connecting the circuit to the junction box and junction box locations 4 are also indicated.

Figure 3:
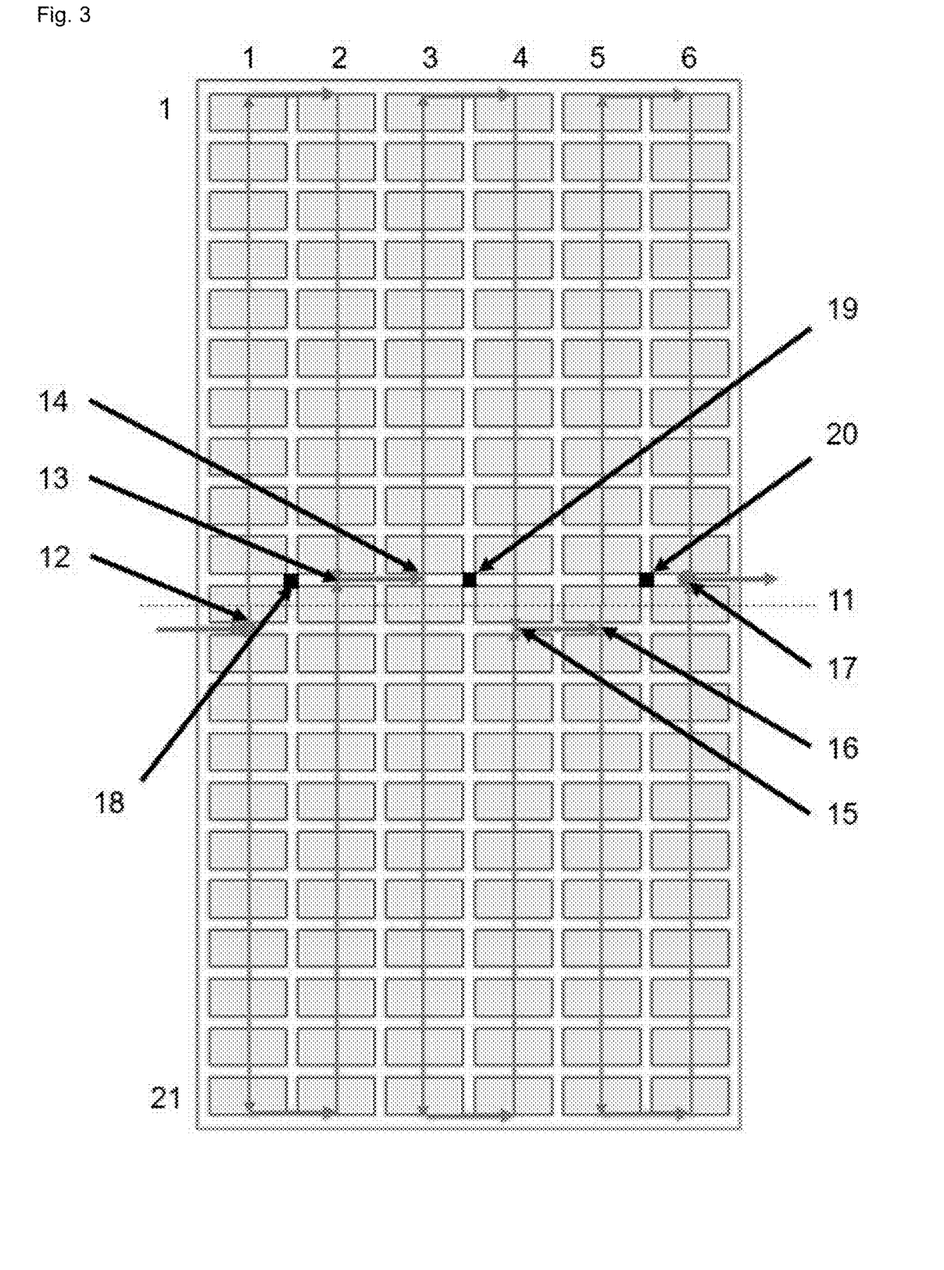
FIG. 3 depicts a schematic of an embodiment of a 126 half-cell module.

Turning now to FIG. 3, a module is depicted comprising 126 half-cells in six columns, numbered 1, 2, 3, 4, 5, 6, and twenty-one rows, with only rows 1 and 21 being numbered. Current flow is depicted by the lines and arrows that are not associated with reference numbers. A line of symmetry 11 of the module cell layout bisects each half-cell in the 11$^{th}$ row of half-cells. The depicted module comprises six strings of half-cells: a first string of half-cells 1-11 in column 1 and half-cells 1-10 in column 2; a second string of half-cells 12-21 in column 1 and 11-21 in column 2; a third string of half-cells 1-11 in column 3 and half-cells 1-10 in column 4; a fourth string of half-cells 12-21 in column 3 and 11-21 in column 4; a fifth string of half-cells 1-11 in column 5 and half-cells 1-10 in column 6; and a sixth string of half-cells 12-21 in column 5 and 11-21 in column 6.

A first group of half-cells comprises strings 1 and 2, a second group comprises strings 3 and 4, and a third group comprises strings 5 and 6. Strings 1 and 2 are connected in parallel to form a first group of half-cells, strings 3 and 4 are connected in parallel to from a second group of half-cells, and strings 5 and 6 are connected in parallel to form a third group of half-cells. The three groups are connected in series. Strings 1 and 2 are connected in parallel and have electrically common points at 12 and 13, strings 3 and 4 are connected in parallel and have electrically common points at points 14 and 15, and strings 5 and 6 are connected in parallel and have electrically common points at points 16 and 17. Groups 1 and 2 are connected in series between location 13 and 14. Groups 2 and 3 are connected in series between location 15 and 16. The module comprises three junction boxes 18, 19, 20.

In an embodiment, the center of a parallel connection area between two strings is not present along the line of symmetry of the module cell layout. Connections are not made at points or lines in a back-contact module, but rather as an area of the conductive backsheet. In an embodiment, the centers of all the connection areas between adjacent groups of half-cells are not present along the line of symmetry of the module cell layout. In an embodiment, the center of a first series connection area between adjacent groups is present on a first half of the module and the center of a second series connection area between adjacent groups is present on a second half of the module. In an embodiment, the centers of all parallel connection areas between strings are not present along the line of symmetry of the module cell layout. In an embodiment, the centers of all series connection areas between groups are not present along the line of symmetry of the module cell layout. In an embodiment, the module comprises a junction box along a line of symmetry.

In addition to the advantages mentioned above, manufacture of half-cells modules with a conductive backsheet may not have the same impact on module manufacturing throughput as for conventional tabbed modules. The number of cells is doubled as compared to a full-cell module, but there is no additional tabbing or interconnection material needed as is the case for conventional tabbed half-cell modules. The circuit is integrated in the conductive backsheet and may be no more complex than the circuit for a full-size 60 cell back-contact module.

In an embodiment, the half-cells comprise crystalline half-cells, such as metal wrap through (MWT) or emitter wrap through (EWT) cells. In an embodiment, the half-cells comprise interdigitated-back-contact (IBC) cells. In an embodiment, the backside of the IBC cell comprises positive and negative contact pads. In an embodiment, the backside of the IBC cell comprises the same or a similar amount of positive and negative contact pads to ensure good current transport from cell to cell and efficient current collection of the cell.

The Photovoltaic modules according to the present invention further comprise an electro-conductive backsheet for contacting the electrical contacts on the rear surface of the solar cells. Typically, such a backsheet comprises a polymer layer and a conductive layer. For connection of a junction box at the back of the module, the polymer layer at the rear side of the module should be locally opened and tabs from the junction box soldered to the conductive layer.

The polymeric backsheet as mentioned herein means a backsheet comprising at least one polymeric layer. In the case that one polymeric layer is present, the backsheet is called a monolayer backsheet. In the case that more polymeric layers are present, the backsheet is called a multilayer backsheet. The electro-conductive backsheet preferably comprises at least 2 and up to 8 polymeric layers. In an embodiment, the polymeric layer(s) comprise thermoplastic or thermosetting polymers. A thermoplastic polymer is a polymer that becomes pliable or moldable above a specific temperature and solidifies upon cooling. Thermoplastics differ from thermosetting polymers in that thermosetting polymers form irreversible chemical bonds during a curing process. Thermosets do not melt but decompose and do not reform upon cooling. Thermoplastic polymer layers are preferred. In an embodiment, the thermoplastic polymers used in the backsheet are selected from the group consisting of polyolefins, polyamides, polyesters, fluorinated polymers, or combinations thereof. In an embodiment, the polymers are polyolefins and/or polyamides and/or polyesters.

The different layers in the electro-conductive backsheet may comprise inorganic fillers or additives. Preferred inorganic fillers are titanium dioxide, zinc oxide or talc. The layers may comprise from 0.05-20 wt. % inorganic filler and or additives, more preferably from 5-15 wt. % inorganic filler and/or additives based on the total weight of the polymers in the different layers.

The conductive layer comprises at least one metal layer such as copper, aluminum, tin, silver or nickel, but may also comprise two metal layers such as copper and aluminum. Preferably the conductive layer comprises copper (Cu).

In an embodiment, the manufacturing of a photovoltaic module comprising 126, 138 or 150 back-contact half-cells in which the half-cells are divided into 3 groups of each 2 parallel strings with each string containing ⅙ of the total number of half-cells whereby the module comprises an additional row of 6 back-contact half-cells when compared to a tabbed half-cell module whereby a pick-and-place process is used to position the 126, 138 or 150 back-contact half-cells comprises the step of using a pick-and-place process to position the half-cells. A pick-and-place process is known in the art and for example disclosed in WO2017019308.

During manufacture the cells may be picked from a cassette using a vacuum gripper, moved by a robot holding the gripper to the correct position relative to the conductive backsheet. These grippers can be adapted to pick two half-cells at the same time so allowing the throughput to be the same as for full-size cells and significantly faster than with conventional tabbing.

In an embodiment, the photovoltaic module according to the present invention comprises the following layers in order of position from the front sun-facing side to the back non-sun-facing side: (1) a transparent pane (representing the front sheet), (2) a front encapsulant layer, (3) the solar cell layer, (4) a back encapsulant layer, and (5) the electro-conductive backsheet, representing the rear protective layer of the module.

The front sheet is typically a glass plate or especially for flexible modules a layer of fluorinated polymers like ETFE (ethylene tetrafluoroethylene) or PVDF (polyvinylidene fluoride).

The front and back encapsulant used in solar cell modules are designed to encapsulate and protect the fragile solar cells. The "front side" corresponds to a side of the photovoltaic cell primarily irradiated with light, i.e. the light-receiving side, whereas the term "backside" corresponds to the reverse side of the light-receiving side of the photovoltaic cells.

Suitable polymer materials for solar cell encapsulants typically possess a combination of characteristics such as high impact resistance, high penetration resistance, good ultraviolet (UV) light resistance, good long-term thermal stability, adequate adhesion strength to glass and/or other rigid polymeric sheets, high moisture resistance, and good long-term weather ability.

EXAMPLES

Example 1

A comparison of power output for a back-contact module containing 60 full-size MWT cells and 126 MWT half-cells is conducted. A power output improvement of 18 W is seen with only a small difference in cell efficiency. The results are shown in the below table.

| Number of cells | Cell efficiency | Power output (Wp) |
| --- | --- | --- |
| 60 full-size MWT | 21.4% | 298 |
| 126 half-cell MWT | 21.9% | 317 |

If it is assumed that cell efficiency is equal, a power output improvement of 16 W is seen, as shown in the below table:

| Number of cells | Cell efficiency | Power output (Wp) |
| --- | --- | --- |
| 60 full-size MWT | 21.5% | 315 |
| 126 half-cell MWT | 21.5% | 331 |

Example 2

A calculation of module dimension, peak power, and power density for conventional full-size modules, half-cell variants, and the equivalent back-contact modules is conducted. The same cell efficiency is considered for all modules. The model is based on known cell-to-module losses and number of cells. The area is calculated by cell-to-cell spacing and ribbon positioning. The parameters used in the calculation are shown in the below table.

| Variable | Conventional | Back-contact |
|---|---|---|
| Cell size (M2) | 156.75 mm | 156.75 mm |
| Cell to cell spacing | 2.5 mm | 1 mm |
| String to string spacing | 2.5 mm | 1 mm |
| Clearance at module edge as per IEC61730 | 13 mm | 13 mm |
| Space for bussing | 30 mm (full cells)/ 35 mm (half-cells) | 0 mm |
| CTM loss (black module) | 3.5% (full cells)/ 1.5% (half-cells) | 0.5% (full cell)/ 0.25% (half-cell) |

The module area of a conventional half-cell module is equivalent to that of a back-contact module made with 6 additional half-cells. Power density is the ratio between power output and module area. The calculated data is presented in the below table.

| Module type | Power output (Wp) | Module Area (m$^2$) | Power Density (Wp/m$^2$) |
|---|---|---|---|
| 60 full-size conventional | 306 | 1.61 | 190 |
| 120 half-cell conventional | 312 | 1.64 | 190 |
| 132 half-cell conventional | 342 | 1.80 | 191 |
| 144 half-cell conventional | 375 | 1.96 | 191 |
| 60 full-size MWT | 315 | 1.56 | 203 |
| 126 half-cell MWT | 331 | 1.64 | 201 |
| 138 half-cell MWT | 363 | 1.80 | 202 |
| 150 half-cell MWT | 394 | 1.95 | 202 |

Additional Description of Exemplary Embodiments

1. A photovoltaic module comprising 126, 138, or 150 back-contact half-cells, wherein the width or length of the module is equivalent to a tabbed module containing 120, 132 or 144 half-cells.
2. A photovoltaic module comprising 126, 138, or 150 back-contact half-cells, wherein the area of the module is equivalent to the area of a tabbed module containing 120, 132 or 144 half-cells, respectively.
3. A photovoltaic module comprising 126, 138, or 150 back-contact half-cells, wherein the back-contact half-cells are arranged in 6 columns, each column comprising an equal number of half-cells.
4. The photovoltaic module according to any one of the preceding exemplary embodiments, wherein the half-cells are arranged in columns and rows, each column having an equal number of half-cells, each row having an equal number of half-cells, and each column comprising an odd number of half-cells.
5. The photovoltaic module wherein the sun-facing face is rectangular.
6. The photovoltaic module according to any one of the preceding exemplary embodiments, wherein tabbed module has a cell-to-cell spacing of about 2.5 mm.
7. The photovoltaic module according to any one of the preceding exemplary embodiments, wherein the photovoltaic module comprising back-contact half-cells has a cell to cell spacing of 1 mm.
8. The photovoltaic module according to any one of the preceding exemplary embodiments, wherein the half-cells are divided into 3 groups, each group comprising 2 parallel strings, and each string containing ⅙ of the total number of half-cells.
9. The photovoltaic module according to any one of the preceding exemplary embodiments, wherein the half-cells are divided into 3 groups connected to each other in series, each group comprising 2 strings connected to each other in parallel, and each string containing ⅙ of the total number of half-cells in the photovoltaic module.
10. The photovoltaic module according to any one of the preceding exemplary embodiments, wherein the module comprises 6 columns and 21 rows of half-cells.
11. The photovoltaic module according to any one of the preceding exemplary embodiments, wherein the module comprises 6 columns and 23 rows of half-cells.
12. The photovoltaic module according to any one of the preceding exemplary embodiments, wherein the module comprises 6 columns and 25 rows of half-cells.
13. The photovoltaic module according to any one of the preceding exemplary embodiments, wherein each group is associated with at least one bypass diode.
14. The photovoltaic module according to any one of the preceding exemplary embodiments, wherein each group is associated with at least one junction box.
15. The photovoltaic module according to any one of the preceding exemplary embodiments, wherein the module comprises crystalline half-cells.
16. The photovoltaic module according to any one of the preceding exemplary embodiments, wherein the half-cells are interdigitated-back-contact (IBC) cells.
17. The photovoltaic module according to any one of the preceding exemplary embodiments, wherein the half-cells are interdigitated-back-contact (IBC) cells and the backside of the IBC cell comprises positive and negative contact pads.
18. The photovoltaic module according to embodiment 7, wherein the backside of the IBC cell comprises a near equal amount of positive and negative contact pads.
19. The photovoltaic module according to any one of the preceding exemplary embodiments, further comprising an electro-conductive backsheet.
20. The photovoltaic module according to any one of the preceding exemplary embodiments, further comprising an electro-conductive backsheet comprising a conductive layer and at least one polymeric layer.
21. The photovoltaic module according to any one of the preceding exemplary embodiments, further comprising an electro-conductive backsheet comprising a conductive layer and at least one polymeric layer, wherein the conductive layer comprises a pattern forming parallel and series connections between the back-contact half-cells.
22. The photovoltaic module according to any one of the preceding exemplary embodiments, further comprising a conductor track, a junction box, and a conductive backsheet comprising a conductive layer, wherein the conductor track is included in the pattern of the conductive layer of the conductive backsheet.
23. The photovoltaic module according to any one of the preceding exemplary embodiments, further comprising a conductor track, a junction box, and a conductive backsheet comprising a conductive layer, wherein the conductor track is included in the pattern of the conductive layer of the conductive backsheet, wherein the conductor track is present between two strings of half-cells.
24. The photovoltaic module according to any one of the preceding exemplary embodiments, further comprising a conductor track, a junction box, and a conductive backsheet comprising a conductive layer, wherein the conductor track is included in the pattern of the conductive layer of the conductive backsheet, wherein the conductor track is present between two strings of half-cells, and wherein the junction box is present at a position along the conductor track.

25. The photovoltaic module according to any one of the preceding exemplary embodiments, wherein the module comprises 126 back-contact half-cells arranged in 6 columns and 21 rows.

26. The photovoltaic module according to any one of the preceding exemplary embodiments, wherein the module comprises 138 back-contact half-cells arranged in 6 columns and 23 rows.

27. The photovoltaic module according to any one of the preceding exemplary embodiments, wherein the module comprises 150 back-contact half-cells arranged in 6 columns and 25 rows.

28. The photovoltaic module according to any one of the preceding exemplary embodiments, wherein a line of symmetry of the module cell layout bisects each half-cell in the middle row of half-cells.

29. The photovoltaic module according to any one of the preceding exemplary embodiments, wherein a line of symmetry of the module cell layout bisects lengthwise each half-cell in a row of half-cells.

30. The photovoltaic module according to any one of the preceding exemplary embodiments, wherein the half-cells are arranged in three groups, each group comprises the half-cells of two columns, and each group comprises ⅓ of the total number of half-cells in the module.

31. The photovoltaic module according to any one of the preceding exemplary embodiments, wherein the module comprises six strings of half-cells, each string of half-cells comprising ⅙ the total number of half-cells in the module.

32. The photovoltaic module according to any one of the preceding exemplary embodiments, wherein a first group of half-cells comprises a first string of half-cells and a second string of half-cells, a second group of half-cells comprises a third string of half-cells and a fourth string of half-cells, and a third group of half-cells comprises a fifth group and a sixth group of half-cells.

33. The photovoltaic module according to any one of the preceding exemplary embodiments, wherein the module comprises a plurality of groups of half-cells, each group of half-cells comprising a plurality of strings of half-cells, and wherein each string in a given group is connected in parallel to the other string(s) in the same group.

34. The photovoltaic module according to any one of the preceding exemplary embodiments, wherein the module comprises a plurality of groups of half-cells, each group of half-cells comprising a plurality of strings of half-cells, and wherein each string in a given group is connected in parallel to the other string(s) in the same group and each group is connected in series to at least one other group.

35. The photovoltaic module according to any one of the preceding exemplary embodiments, wherein each string comprises one and only one half-cell present on a line of symmetry of the module cell layout.

36. The photovoltaic module according to any one of the preceding exemplary embodiments, wherein the center of a parallel connection area between two strings is not present along a line of symmetry of the module cell layout.

37. The photovoltaic module according to any one of the preceding exemplary embodiments, wherein the centers of all parallel connection areas between strings are not present along a line of symmetry of the module cell layout.

38. The photovoltaic module according to any one of the preceding exemplary embodiments, wherein the centers of all series connection areas between groups are not present along the line of symmetry of the module cell layout.

39. The photovoltaic module according to any one of the preceding exemplary embodiments, wherein the centers of all parallel connection areas between strings and the centers of all series connection areas between groups are not present along a line of symmetry of the module cell layout.

40. The photovoltaic module according to any one of the preceding exemplary embodiments, wherein in a group of half-cells comprising a plurality of strings connected in parallel, the center of a first electrically common area is present on a first half of the module and the center of a second electrically common area, downstream of the first electrically common area, is present on a second half of the module.

41. The photovoltaic module according to any one of the preceding embodiments, wherein the center of a first series connection area between adjacent groups of half-cells is present on a first half of the module and the center of a second series connection area between adjacent groups of half-cells is present on a second half of the module.

42. The photovoltaic module according to any one of the preceding exemplary embodiments, wherein a junction box along a line of symmetry of the module cell layout.

43. The photovoltaic module according to any one of the preceding exemplary embodiments, wherein each half-cell has a dimension of 156 mm×78 mm, 159 mm×80 mm, or 161 mm×81 mm.

44. The photovoltaic module according to any one of the preceding exemplary embodiments, wherein each half-cell has a dimension of from 155 mm to 162 mm by 77 mm to 82 mm.

45. The photovoltaic module according to any one of the preceding exemplary embodiments, wherein the photovoltaic module comprises 126 back-contact half-cells and has an overall dimension of from 1617 to 1680 mm by from 975 mm to 997 mm.

46. The photovoltaic module according to any one of the preceding exemplary embodiments, wherein the photovoltaic module comprises 126 back-contact half-cells and has an overall dimension of from 1617 to 1639 mm by from 975 mm to 985 mm.

47. The photovoltaic module according to any one of the preceding exemplary embodiments, wherein the photovoltaic module comprises 126 back-contact half-cells and has an overall dimension of from 1645 to 1680 mm by from 987 mm to 997 mm.

48. The photovoltaic module according to any one of the preceding exemplary embodiments, wherein each half-cell has a dimension of 156 mm×78 mm, 159 mm×79 mm, 162 mm×81, or 166 mm×83 mm.

49. The photovoltaic module according to any one of the preceding exemplary embodiments, wherein each half-cell has a dimension of 156.8 mm×78.4 mm, 158.8 mm×79.4 mm, 161.8 mm×80.9, or 166 mm×83 mm.

50. The photovoltaic module according to any one of the preceding exemplary embodiments, wherein each half-cell has a dimension of from 155 mm to 166 mm by 77 mm to 83 mm.

51. The photovoltaic module according to any one of the preceding exemplary embodiments, wherein the photovoltaic module comprises 126 back-contact half-cells and has an overall dimension of from 1675 to 1800 mm by from 955 mm to 1035 mm.

52. The photovoltaic module according to any one of the preceding exemplary embodiments, wherein the photovoltaic module comprises 138 back-contact half-cells and has an overall dimension of from 1835 mm to 1965 mm by from 955 to 1035 mm.

53. The photovoltaic module according to any one of the preceding exemplary embodiments, wherein the photovoltaic module comprises 150 back-contact half-cells and has an overall dimension of from 1995 to 2132 by from 955 to 1035 mm.

54. A process for the manufacturing of a photovoltaic module comprising back-contact half-cells according to any one of the preceding exemplary embodiments, comprising the step of using a pick-and-place process to position the half-cells.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. While certain optional features are described as embodiments of the invention, the description is meant to encompass and specifically disclose all combinations of these embodiments unless specifically indicated otherwise or physically impossible.

The invention claimed is:

1. A photovoltaic module comprising 126, 138, or 150 back-contact half-cells, wherein the back-contact half-cells are arranged in 6 columns and a plurality of rows, each column comprising an equal odd number of half-cells and each row having an equal number of half-cells, wherein the back-contact half-cells are arranged into a plurality of strings, wherein each string in the plurality of strings has an odd number of back-contact half-cells, wherein each string in the plurality of strings spans two columns, wherein each column includes a portion of back-contact half-cells from two strings of the plurality of strings, and wherein a connection point between the two strings of the plurality of strings in each column is staggered about a line of symmetry of the photovoltaic module in adjacent columns.

2. The photovoltaic module according to claim 1, wherein the half-cells are divided into 3 groups, each group comprising 2 strings connected in parallel, and each string containing 1/6 of the total number of half-cells.

3. The photovoltaic module according to claim 2, wherein each group includes at least one bypass diode.

4. The photovoltaic module according to claim 3, wherein each group includes at least one junction box.

5. The photovoltaic module according to claim 1, wherein a line of symmetry of the module cell layout bisects lengthwise each half-cell in a row of half-cells.

6. The photovoltaic module according to claim 1, wherein the module comprises a plurality of groups of half-cells, each group of half-cells comprising the plurality of strings of half-cells, and wherein each string in a given group is connected in parallel to the other string(s) in the same group and each group is connected in series to at least one other group.

7. The photovoltaic module according to claim 6, wherein the centers of all parallel connection areas between strings and the centers of all series connection areas between groups are not present along a line of symmetry of the module cell layout.

8. The photovoltaic module according to claim 6, wherein in a group of half-cells comprising the plurality of strings connected in parallel, the center of a first electrically common area is present on a first half of the module and the center of a second electrically common area, downstream of the first electrically common area, is present on a second half of the module.

9. The photovoltaic module according to claim 6, wherein the center of a first series connection area between adjacent groups of half-cells is present on a first half of the module and the center of a second series connection area between adjacent groups of half-cells is present on a second half of the module.

10. The photovoltaic module according to claim 1, further comprising an electro-conductive backsheet.

11. The photovoltaic module according to claim 10, wherein the electro-conductive backsheet comprises a conductive layer and at least one polymeric layer.

12. The photovoltaic module according to claim 11, wherein the conductive layer comprises a pattern forming parallel and series connections between the back-contact half-cells.

13. The photovoltaic module according to claim 1, further comprising a conductor track, a junction box, and a conductive backsheet comprising a conductive layer, wherein the conductor track is included in the pattern of the conductive layer of the conductive backsheet.

14. The photovoltaic module according to claim 13, wherein the conductor track is present between two strings of half-cells.

15. The photovoltaic module according to claim 14, wherein the junction box is present at a position along the conductor track.

16. The photovoltaic module according to claim 1, wherein each half-cell has a dimension of 156 mm×78 mm, 159 mm×80 mm, or 161 mm×81 mm.

17. The photovoltaic module according to claim 1, wherein each half-cell has a dimension of from 155 mm to 162 mm by 77 mm to 82 mm.

18. The photovoltaic module according to claim 1, wherein the photovoltaic module comprises 126 back-contact half-cells and has an overall dimension of from 1617 to 1680 mm by from 975 mm to 997 mm.

19. The photovoltaic module according to claim 1, wherein the photovoltaic module comprises 126 back-contact half-cells and has an overall dimension of from 1617 to 1639 mm by from 975 mm to 985 mm.

20. The photovoltaic module according to claim 1, wherein the photovoltaic module comprises 126 back-contact half-cells and has an overall dimension of from 1645 to 1680 mm by from 987 mm to 997 mm.

21. A process for the manufacturing of a photovoltaic module comprising back-contact half-cells according to claim 12, comprising the step of using a pick-and-place process to position the half-cells.

\* \* \* \* \*